(12) United States Patent
Sun et al.

(10) Patent No.: US 6,784,003 B2
(45) Date of Patent: Aug. 31, 2004

(54) QUICK TURN AROUND TIME SYSTEM AND METHOD OF USE

(75) Inventors: Lin-Sheng Sun, Fengshan (TW); Max Tuw, Hsinchu (TW); Wen Che Lu, Tainan (TW); Arthur Chen, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 64 days.

(21) Appl. No.: 10/266,332

(22) Filed: Oct. 8, 2002

(65) Prior Publication Data

US 2004/0067601 A1 Apr. 8, 2004

(51) Int. Cl.⁷ ............................................... H01L 21/66
(52) U.S. Cl. ....................................................... 438/14
(58) Field of Search ..................................... 438/14, 52

(56) References Cited

U.S. PATENT DOCUMENTS 6,303,395 B1 * 10/2001 Nulman ........................ 438/14

* cited by examiner

Primary Examiner—John F. Niebling
Assistant Examiner—Andre' C. Stevenson
(74) Attorney, Agent, or Firm—Tung & Associates

(57) ABSTRACT

The invention provides a quick turn around time system (QTAT) for locating an optimal arrangement of work orders within a wafer fabrication facility providing: a real time dispatching system having a software rule database; and at least one piece of fabrication equipment having an internal buffer in communication with the software rule database, wherein the real time dispatching system and the at least one piece of fabrication equipment cooperate to optimally prioritize a work order disposed within the internal buffer of the at least one piece of fabrication equipment. A load port reservation system for in-line processing and a plurality of batch editing functions for controlling batch formation is provided. Additionally provided are two alternative methods of using the QTAT to optimally prioritize work orders within the at least one piece of fabrication equipment's internal buffer.

20 Claims, 3 Drawing Sheets

QUICK TURN AROUND TIME SYSTEM AND METHOD OF USE

FIELD OF THE INVENTION

The present invention is directed to a quick turn around time system and method of use for improving wafer processing within an automated wafer fabrication FAB.

BACKGROUND

In a wafer fabrication facility, preferably a 300 mm FAB, production equipment operates using a first in, first out (FIFO) sequencing rule for processing work orders of wafer lots. High priority work orders or super hot lots are also processed in sequence according to the FIFO rule. Existing automated FABs that use the FIFO sequencing rule do not provide an adequate means for sequencing high priority orders or super hot lots for processing before lower priority work orders once work orders have been tracked into a piece of fabrication. Therefore, high priority or super hot lots will be queued in internal equipment buffers and must wait a long time in equipment before being processed.

Typically, in a semiconductor wafer process, an operator conventionally performs an operation of forming works such as wafers into a batch. In particular, from within a plurality of works transported to a batch processing piece of fabrication equipment, those of the works for which processing conditions are the same are selected by the operator, and a predetermined number of such works are put in order and formed into a batch and then supplied to the batch processing piece of fabrication equipment by the operator.

Further, the operator has a heavy responsibility in that the operator must form works into a batch after a preferential order of the works is recognized. The presence of the operator presents an undesirable labor intensive impediment. In addition, as the size of wafers to be handled increases, the number of works which can be prepared for a production line decreases, and as a result, the batch process piece of fabrication equipment fails in formation of a batch from a predetermined number of works.

Batches of wafer lots are formed during batch processing and are inserted into a batch processing piece of fabrication equipment's internal queue. However, once inserted into the batch processing equipment's internal queue, the formed batch cannot be modified. A batch is formed only from the works currently prepared for the batch process piece of fabrication equipment, even if works having a higher preferential degree or degrees than the works prepared in the batch are prepared for the batch process apparatus before the prepared works are actually processed by the batch process piece of fabrication equipment. When the number of works equal to the predetermined formation number is already prepared for the batch process piece of fabrication equipment, the works of the higher preferential degree are left without being supplied until the next timing for formation of a batch. Formed batched are not processed preferentially but are processed after processing of other works.

Thus, if a super hot lot needs immediate processing, the super hot lot batch must wait for the formed batch to be processed before the super hot lot batch may be tracked into a piece of batch fabrication equipment. As a result, failure in delivery of products on or prior to the delivery date can occur. It is desirable to provide an adjustable internal buffering queue disposed a piece of fabrication equipment that cooperates with a real time dispatching system to prioritize wafer lot orders disposed within a piece of fabrication equipment.

It is desirable to optimize dispatching rules within an adjustable internal buffering queue disposed within a piece of fabrication equipment.

It is desirable to ensure high priority or super hot lots can be processed before lower priority lots.

It is desirable to create a dispatching mechanism to speed up production lots having a high priority turn ratio in a piece of fabrication equipment having an internal buffer.

SUMMARY OF THE INVENTION

The present invention provides equipment automation for wafer fabrication facility, preferably a 300 mm FAB, for optimally processing super hot lots within a piece of fabrication equipment having an internal buffer. The present invention provides internal buffer optimization for both in-line processing pieces of fabrication equipment and batch processing pieces of fabrication equipment. The present invention further provides a load port reservation for optimally tracking in a work order into a piece of fabrication equipment.

The piece of fabrication equipment's software is integrated with a host real time dispatching (RTD) system to establish processing capacity adjusted according to processing order for production equipment. To make processing equipment more efficient, dispatching rules are optimized for lots entered into an internal buffer in accordance with a software rule database. The rule database further provides for inserting super hot lots into a pre-WIP list disposed within the real time dispatching system. Thus, super hot lot or high priority lots will be processed in a lot by lot manner.

The present invention provides delay timing for editable batch formation, allowing for batches waiting to be processed within a piece of fabrication equipment to be edited by adding, removing, or exchanging a batch.

More particularly, the present invention provides a quick turn around time (QTAT) system for locating an optimal arrangement of work orders within a wafer fabrication facility providing:
  a real time dispatching system having a software rule database; and
  at least one piece of fabrication equipment having an internal buffer in communication with the software rule database, wherein the real time dispatching system and the at least one piece of fabrication equipment cooperate to optimally prioritize a work order disposed within the internal buffer of the at least one piece of fabrication equipment in accordance with instructions specified by the real time dispatching system software rule database.

The quick turn around time system further has:
  an equipment operator interface in operative communication with the at least one piece of fabrication equipment, wherein the equipment operator interface is in further operative communication with the real time dispatching system for prioritizing at least one work order disposed within the internal buffer of the at least one piece of fabrication equipment, wherein the real time dispatching system rule database cooperates with the equipment operator interface to insert at least one super hot lot work order into a real time dispatch system pre-work in progress list in accordance with the rule database.

Additionally, the present invention provides a method of using the QTAT, the method of use having the steps of:
  providing a real time dispatching system having software rule database;

providing at least one piece of fabrication equipment having an internal buffer in communication with the software rule database; and prioritizing a work order disposed within the internal buffer of the at least one piece of fabrication equipment in accordance with instructions specified by the real time dispatching system software rule database.

Additionally, the method further has the step of:

providing an equipment operator interface in operative communication with the at least one piece of fabrication equipment, wherein the equipment operator interface is in further operative communication with the real time dispatching for prioritizing at least one work order disposed within the internal buffer of the at least one piece of fabrication equipment.

The method further has the steps of:

tracking in a work order into a piece of fabrication equipment using the real time dispatching system;

selecting a process to be performed on a work order;

processing the optimally prioritized work order disposed within the internal buffer of the piece of fabrication equipment; and tracking out the completed processed work order from the piece of fabrication equipment.

The step of tracking in a work order into a piece of fabrication equipment further has the step of using a load port reservation system in communication with the real time dispatching system for optimally tracking work orders into a piece of in-line processing equipment, wherein the step of using the load port reservation system for optimally tracking a work order into a piece of in-line processing equipment further has the steps:

identifying at least two pieces of fabrication equipment capable of performing a same specified recipe for processing a work order, the at least two pieces of fabrication equipment each having an associated load port;

checking the availability status of each associated load port; and sending an available work order to a first available one of the associated load ports for processing by the associated piece of fabrication equipment having the first available load port.

Additionally, the step of tracking in a work order into a piece of fabrication equipment further may optionally provide the step of:

using a plurality of batch edit functions for optimally tracking work orders into a piece of batch processing equipment using the equipment operator interface to select a batch edit function, wherein the batch edit function is selected from the group of add, remove, and exchange.

An alternative method of using the QTAT is provided herein, wherein the alternative method of using a quick turn around time system to optimize dispatching of work orders within a wafer fabrication facility has the steps of:

providing a real time dispatcher having a work in progress list, and a pre-work in progress list for managing work orders;

providing a user interface in operative communication with the real time dispatching;

using the real time dispatcher rule database to optimize an internal buffer disposed within a piece of fabrication equipment;

using the real time dispatcher rule database to a provide a load port reservation system;

using the real time dispatcher rule database to delay timing for forming a batch for batch processing; and using the real time dispatcher rule database to insert a super hot lot work order into the pre-work in progress list.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention optimizes wafer processing within a piece of fabrication equipment by locating a best arrangement inside an equipment's internal buffer by providing a quick turn around time (hereinafter, "QTAT") system and method for processing of wafers within a wafer fabrication facility.

More particularly, the present invention provides a QTAT system for locating an optimal arrangement of work orders within a wafer fabrication facility, the QTAT system providing:

a real time dispatching (hereinafter, "RTD") system having a software rule database; and at least one piece of fabrication equipment having an internal buffer in communication with the software rule database, wherein the real time dispatching system and the at least one piece of fabrication equipment cooperate to optimally prioritize a work order disposed within the internal buffer of the at least one piece of fabrication equipment in accordance with instructions specified by the real time dispatching system software rule database.

Additionally, an equipment operator interface is provided for a technician equipment operator to unload a work order from a piece of fabrication equipment to allow for exception handling of work orders disposed within a piece of processing equipment. Additionally provided is a load port reservation system for quick turn around time for wafer processing within in-line buffers for pieces of equipment having in-line processing.

The RTD system cooperates with the at least one piece of fabrication equipment to adjust an internal buffer queue within an in-line processing piece of fabrication equipment, and to edit a batch waiting to be processed within batch processing piece of fabrication equipment.

Figure 1:
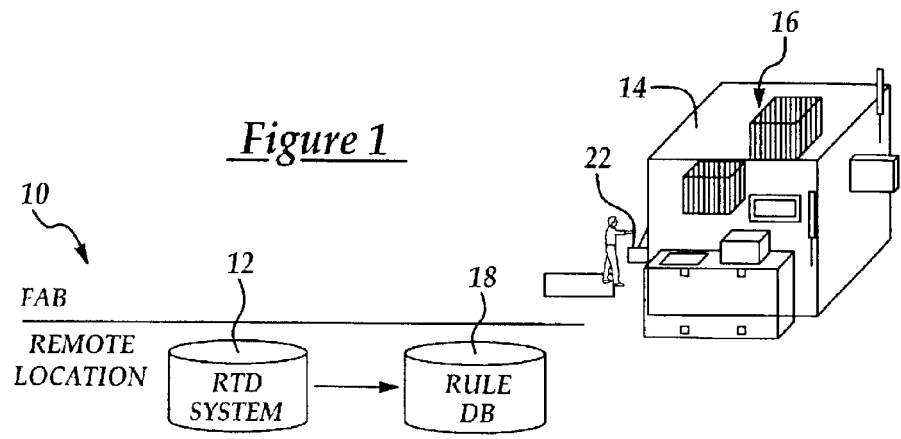
FIG. 1 is an overview of a QTAT system in accordance with the present invention.

Referring now to the figures, FIG. 1 illustrates a QTAT system 10 having a real time dispatching system 12, and at least one piece of fabrication equipment 14 having an internal buffer 16.

The RTD system 12 has a rule database 18 (not shown) that cooperates with the at least one piece of fabrication equipment 14 to insert high priority work orders or super hot lots into a pre-work in progress (WIP) list 20 in accordance with the RTD system rule database 18.

Preferably, each piece of fabrication equipment 14 is controlled by an associated equipment operator interface 22. Each equipment operator interface 22 is in operative communication with the RTD system 12 that is, typically, provided at a remote location relative to the piece of fabrication equipment 14.

The equipment operator interface 22 can include a display, keyboard, mouse and other input/output devices to communicate with the RTD system 12. The dispatch of work orders, wherein a work order is preferably at least one wafer lot or a plurality of wafer lots and the parameters of procedures or recipes performed by the at least one piece of fabrication equipment 14 are instructed by the RTD system 12.

Additionally, the equipment operator interface 22 is in operative communication with the at least one piece of fabrication equipment 14 and is in further operative communication with the real time dispatching system 12 for prioritizing at least one work order disposed within the internal buffer 16 of the at least one piece of fabrication equipment 14.

Figure 2:
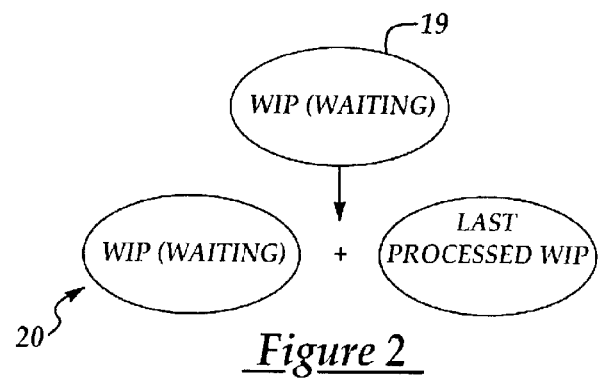
FIG. 2 is an illustration of insertion of a super hot lot into a pre-WIP list.

In a preferred embodiment as shown in FIG. 2, the equipment operator interface 22 cooperates with the real time dispatching system rule database 18 to insert at least one super hot lot work order into the pre-work in progress list 20 in accordance with the rule database 18.

In an alternative preferred embodiment, the at least one piece of fabrication equipment 14 having the internal buffer 16 is an in-line processing piece of equipment. Preferably, the equipment operator interface 22 cooperates with the in-line processing piece of fabrication equipment to prioritize processing of the at least one work order.

Figures 3A, 3B, 3C, 3D:
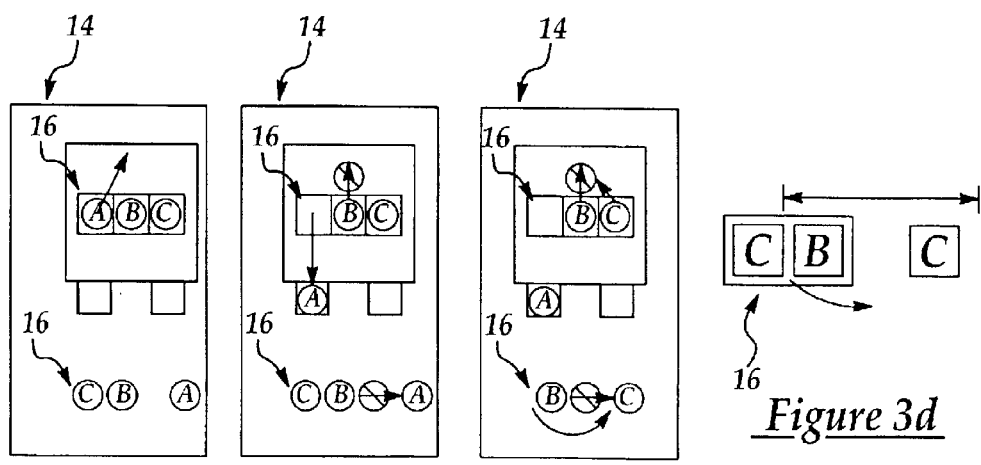
FIG. 3a is an illustration of an in-line processing piece of fabrication equipment having an adjustable internal buffer in accordance with the present invention.
FIG. 3b is an illustration of an in-line processing piece of fabrication equipment having an adjustable internal buffer in accordance with the present invention.
FIG. 3c is an illustration of an in-line processing piece of fabrication equipment having an adjustable internal buffer in accordance with the present invention.
FIG. 3d is an enlarged view of the adjustable internal buffer of the in-line processing piece of fabrication as shown in FIGS. 3a–c.

An alternative preferred embodiment of an in-line processing operation using the QTAT system is shown in FIGS. 3a–d. As shown in FIG. 3a, lot A is to be processed upon removal from the internal buffer 22 of the in-line piece of processing equipment 14. Using a conventional first in first out (FIFO) rule, lot A would be processed first, then lot B, then lot C. The RTD system rule database 18 determines that Lot C waiting to be processed after lot B in the internal buffer 16 is a super hot lot that should be processed before lot B. The RTD system 12 cooperates with the equipment operator interface 22 in operative communication with the internal buffer 16 to process lot A from the internal buffer 16 as shown in FIG. 3b. Using the QTAT system 10, lot A is processed first and is given a "completed" status. Next, as shown in FIGS. 3c–d, a hold is placed on lot B, and lot C is removed from the internal buffer and is immediately processed by the in-line processing piece of fabrication equipment. Finally, lot B, the next wafer lot in the buffer, is removed from the buffer 16 and is processed by the in-line piece of fabrication equipment 14.

Figure 4:
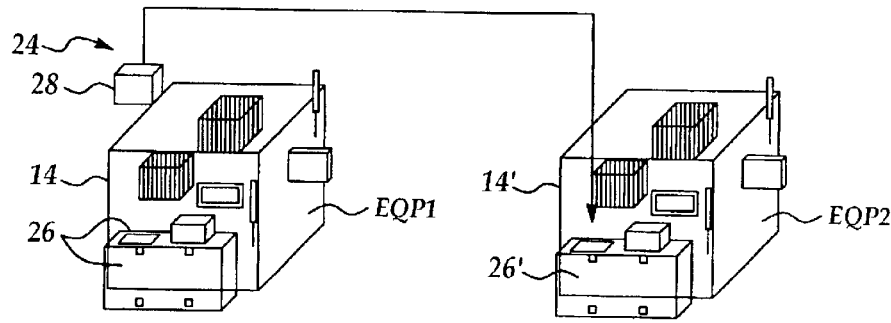
FIG. 4 is an illustration of a load port reservation system in accordance with the present invention.

In another alternative embodiment, the QTAT system 10, as shown in FIG. 4, further provides a load port reservation system 24 for optimizing of dispatching rules in accordance with the software rules database 18 (not shown). The load port reservation system 24 reserves an available load port 26 or 26' associated with one of at least two pieces of in-line processing fabrication equipment 14, 14'.

The load port reservation system is shown in operation, in FIG. 4. A lot 28 is tracked in for one piece of processing equipment (EQP1) 14 capable of performing a specified recipe, the load port reservation system provides a simultaneous reservation for a second piece of fabrication equipment (EQP2) 14' performing a same specified recipe. The lot 28 will be loaded into the first available load port 26 or 26' of either EQP1 or EQP2 respectively. For example, if EQP1 load port 26 becomes available before EQP2's load port 26', then the lot 28 will be processed by EQP1 14, however, if EQP2 14' becomes available before EQP1 14, then the lot will be processed by EQP2 14' first.

In an alternative embodiment, preferably at least one work order comprises at least one batch formed from a plurality of wafer lots. Also preferably, the at least one piece of fabrication equipment having the internal buffer 30 is a batch processing piece of equipment 32, preferably a furnace or a wet bench, for performing batch processing on the at least one batch. Preferably, the internal buffer 30 provides an internal queue for batch processing the at least one batch.

When used with batch processing machines, the equipment operator interface 34 (not shown) manages batch orders for batch processing pieces of fabrication equipment by delaying timing of batch formation within the internal buffer 30. During the delay time, batches disposed within the buffer 30 of the piece of batch processing fabrication equipment 32 may be edited by using a plurality of batch edit functions, wherein the batch edit functions are selected from the group of add, exchange and remove.

Figure 5:
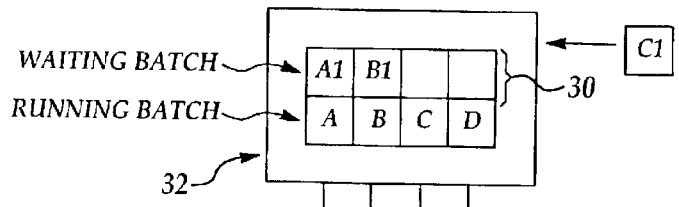
FIG. 5 is an illustration of a batch processing piece of fabrication having an adjustable internal buffer in accordance with the present invention.

In a preferred embodiment, as shown FIG. 5, there are four batches, A–D being run in a batch processing piece of fabrication equipment, preferably a furnace. Batches A1 and B1 are disposed within the internal buffer 30 of the batch processing piece of fabrication equipment 32 and are waiting to be processed by the piece of fabrication equipment 32. To insert a super hot batch C1 into the internal buffer 30 during batch formation, an operator can use a batch edit function disposed within the equipment operator interface 34 to control the placement of batch C1 within the internal buffer 30.

Figure 6:
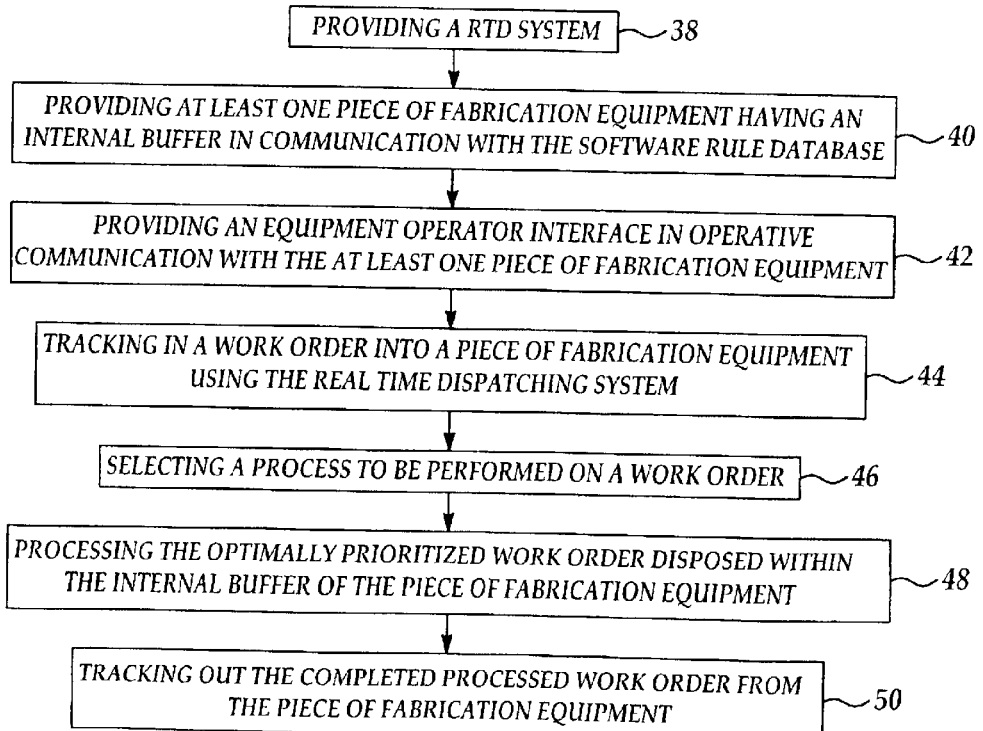
FIG. 6 is a flowchart depicting a method of using the QTAT system of FIG. 1 in accordance with the present invention.
Figure 7:
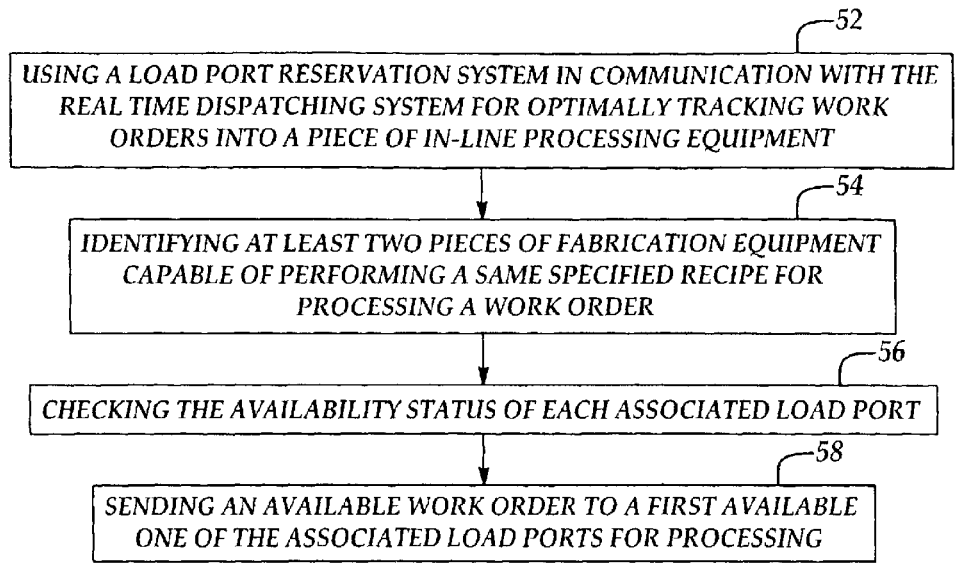
FIG. 7 is a flowchart depicting a method of using the QTAT system of FIG. 1 in accordance with the present invention.

Additionally provided, as shown in FIGS. 6–7, is a method of using the quick turn around time system 10 to optimize dispatching of work orders within a wafer fabrication facility.

The method has the steps of:
 providing a real time dispatching system having software rule database (step 36);
 providing at least one piece of fabrication equipment having an internal buffer in communication with the software rule database (step 38); and
 prioritizing a work order disposed within the internal buffer of the at least one piece of fabrication equipment in accordance with instructions specified by the real time dispatching system software rule database (step 40).

The method preferably, further has the step of:

provide an equipment operator interface in operative communication with the at least one piece of fabrication equipment (step 42), wherein the equipment operator interface is in further operative communication with the real time dispatching for prioritizing at least one work order disposed within the internal buffer of the at least one piece of fabrication equipment.

Preferably, the method further has the steps of:

tracking in a work order into a piece of fabrication equipment using the real time dispatching system (step 44);

selecting a process to be performed on a work order (step 46);

processing the optimally prioritized work order disposed within the internal buffer of the piece of fabrication equipment (step 48); and tracking out the completed processed work order from the piece of fabrication equipment (step 50).

In accordance with an alternative embodiment, the step of tracking in a work order into a piece of fabrication equipment further (step 44) has the step of using a load port reservation system in communication with the real time dispatching system for optimally tracking work orders into a piece of in-line processing equipment (step 52). Preferably, the step of using the load port reservation system for optimally tracking a work order into a piece of in-line processing equipment (step 52) has the steps of:

identifying at least two pieces of fabrication equipment capable of performing a same specified recipe for processing a work order, the at least two pieces of fabrication equipment each having an associated load port (step 54);

checking the availability status of each associated load port (step 56); and sending an available work order to a first available one of the associated load ports for processing by the associated piece of fabrication equipment having the first available load port (step 58).

In an alternative embodiment, the step of tracking in a work order into a piece of fabrication equipment (step 44) further has the step of:

using a plurality of batch edit functions for optimally tracking work orders into a piece of batch processing equipment using the equipment operator interface to select a batch edit function (step 60) (not shown), wherein the batch edit function is selected from the group of add, remove, and exchange.

Figure 8:
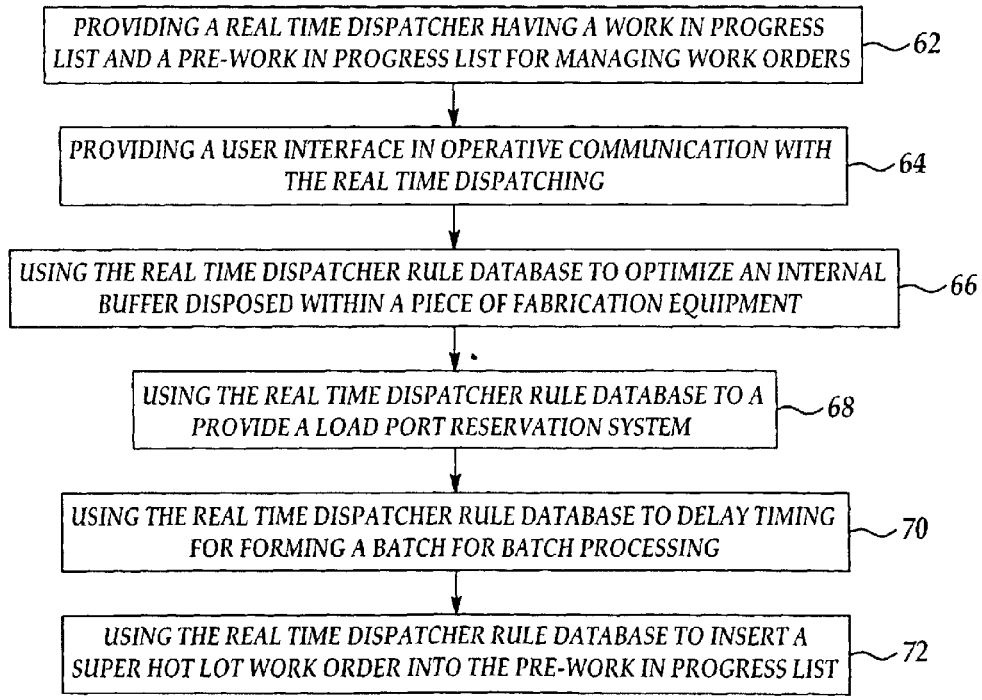
FIG. 8 is a flowchart depicting a method of using the QTAT system of FIG. 1 in accordance with the present invention.

Additionally, as shown in FIG. 8 is an alternative method for using the QTAT system. The alternative method has the steps of:

providing a real time dispatcher having a work in progress list, and a pre-work in progress list for managing work orders (step 62);

providing a user interface in operative communication with the real time dispatching (step 64);

using the real time dispatcher rule database to optimize an internal buffer disposed within a piece of fabrication equipment (step 66);

using the real time dispatcher rule database to a provide a load port reservation system (step 68);

using the real time dispatcher rule database to delay timing for forming a batch for batch processing (step 70); and using the real time dispatcher rule database to insert a super hot lot work order into the pre-work in progress list (step 72).

From the foregoing, it should be appreciated that a QTAT system and method is provided for improving processing of wafers within a wafer fabrication facility. While a plurality of preferred exemplary embodiments have been presented in the foregoing detailed description, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient guide for implementing a preferred embodiment of the invention and various changes can be made in the function and arrangements of the exemplary embodiment without departing from the spirit and scope of the appended claims.

What is claimed is:

1. A quick turn around time system for locating an optimal arrangement of work orders within a wafer fabrication facility, the quick turn around time system comprising:

a real time dispatching system having a software rule database; and at least one piece of fabrication equipment having at least one associated load port and further having an adjustable internal buffer in communication with the software rule database, wherein the adjustable internal buffer has an adjustable internal buffer queue that operates to optimally queue a work order that is disposed within the piece of fabrication equipment in accordance with instructions specified by the real time dispatching system software rule database once the work order is loaded into the piece of fabrication equipment by the load port.

2. The quick turn around time system of claim 1 further comprising:

an equipment operator interface in operative communication with the at least one piece of fabrication equipment, wherein the equipment operator interface is in further operative communication with the real time dispatching system for prioritizing at least one work order disposed within the adjustable internal buffer of the at least one piece of fabrication equipment.

3. The quick turn around time system of claim 2 wherein the real time dispatching system rule database cooperates with the equipment operator interface to insert at least one super hot lot work order into a real time dispatch system pre-work in progress list in accordance with the rule database.

4. The quick turn around time system of claim 3 wherein the at least one piece of fabrication equipment having the adjustable internal buffer performs in-line processing.

5. The quick turn around time system of claim 4 wherein the equipment operator interface cooperates with the in-line processing piece of fabrication equipment to prioritize processing of the at least one work order such that arrangement of the at least one work order is optimally arranged within the adjustable internal buffer queue.

6. The quick turn around time system of claim 5 further comprising a load port reservation system for reserving an available load port associated with the at one piece of in-line processing fabrication equipment.

7. The quick turn around time system of claim 6 wherein the at least one work order is at least one wafer lot.

8. The quick turn around time system of claim 1 wherein the at least one work order comprises at least one batch formed from a plurality of wafer lots.

9. The quick turn around time system of claim 8 wherein the at least one piece of fabrication equipment having the adjustable internal buffer performs batch processing on the at least one batch.

10. The quick turn around time system of claim 9 wherein the adjustable internal buffer queue provides for optimally batch processing the at least one batch.

11. The quick turn around time system of claim 10 wherein the real time dispatcher cooperates with the piece of batch processing fabrication equipment to edit a plurality of batches disposed within the adjustable internal buffer of the at least one piece of batch processing fabrication equipment once the plurality of batches have been loaded into the at least one piece of batch processing fabrication equipment by the load port.

12. The quick turn around time system of claim 11 further comprising a plurality of batch editing functions performed within the at least one piece of batch processing fabrication equipment wherein the plurality of batch editing functions are selected from the group of add, remove, and exchange.

13. The quick turn around time system of claim 12 wherein the batch processing piece of equipment is selected from the group consisting of a furnace and a wet bench.

14. A method of using a quick turn around time system for locating an optimal arrangement of work orders within a wafer fabrication facility, the method comprising the steps of:

providing a real time dispatching system having software rule database;

providing at least one piece of fabrication equipment having a load port and further having an adjustable internal buffer in communication with the software rule database, wherein the adjustable internal buffer has an adjustable internal buffer queue that operates to optimally queue a work order that is disposed within the piece of fabrication equipment; and prioritizing a work order disposed within the adjustable internal buffer, of the at least one piece of fabrication equipment in accordance with instructions specified by the real time dispatching system software rule database.

15. The method of claim 14 further comprising the step of:

providing an equipment operator interface, in operative communication with the at least one piece of fabrication equipment, wherein the equipment operator interface is in further operative communication with the real time dispatching for prioritizing at least one work order disposed within the adjustable internal buffer of the at least one piece of fabrication equipment.

16. The method of claim 15 further comprising the steps of:

tracking in a work order into a piece of fabrication equipment using the real time dispatching system;

selecting a process to be performed on a work order;

processing the optimally prioritized work order disposed within the adjustable internal buffer of the piece of fabrication equipment; and tracking out the completed processed work order from the piece of fabrication equipment.

17. The method of claim 16, wherein the step of tracking in a work order into a piece of fabrication equipment further comprises using a load port reservation system in communication with the real time dispatching system for optimally tracking work orders into a piece of in-line processing equipment.

18. The method of claim 17, wherein the step of using the load port reservation system for optimally tracking a work order into a piece of in-line processing equipment comprises the steps of:

identifying at least two pieces of fabrication equipment capable of performing a same specified recipe for processing a work order, the at least two pieces of fabrication equipment each having an associated load port;

checking the availability status of each associated load port; and sending an available work order to a first available one of the associated load ports for processing by the associated piece of fabrication equipment having the first available load port.

19. The method of claim 15 wherein the step of tracking in a work order into a piece of fabrication equipment further comprises the step of:

using a plurality of batch edit functions for optimally tracking work orders into a piece of batch processing equipment using the equipment operator interface to select a batch edit function, wherein the batch edit function is selected from the group of add, remove, and exchange.

20. A method of using a quick turn around time system for locating an optimal arrangement of work orders within a wafer fabrication facility, the method comprising the steps of:

providing a real time dispatching system having software rule database, wherein the software rule database has a work in progress list, and a pre-work in progress list for managing work orders;

providing a user interface in operative communication with the real time dispatching system;

using the software rule database to optimize an adjustable internal buffer disposed within a piece of fabrication equipment, wherein the adjustable internal buffer has an adjustable internal buffer queue that operates to optimally queue a work order that is disposed within the piece of fabrication equipment;

using the software rule database to a provide a load port reservation system;

using the software rule database to delay timing for forming a batch for batch processing; and using the real time dispatcher rule database to insert a super hot lot work order into the pre-work in progress list.

* * * * *